(12) United States Patent
Zhou

(10) Patent No.: US 12,544,769 B2
(45) Date of Patent: Feb. 10, 2026

(54) METHOD AND APPARATUS FOR MAGNETICALLY SORTING BIOLOGICAL OBJECTS

(71) Applicant: Applied Cells Inc., Santa Clara, CA (US)

(72) Inventor: Yuchen Zhou, San Jose, CA (US)

(73) Assignee: Applied Cells Inc., Santa Clara, CA (US)

( * ) Notice: Subject to any disclaimer, the term of this patent is extended or adjusted under 35 U.S.C. 154(b) by 225 days.

(21) Appl. No.: 18/144,447

(22) Filed: May 8, 2023

(65) Prior Publication Data

US 2023/0338968 A1 Oct. 26, 2023

Related U.S. Application Data

(63) Continuation-in-part of application No. 18/111,486, filed on Feb. 17, 2023, which is a continuation-in-part
(Continued)

(51) Int. Cl.
*B03C 1/28* (2006.01)
*B01L 3/00* (2006.01)
(Continued)

(52) U.S. Cl.
CPC ........ *B03C 1/288* (2013.01); *B01L 3/502761* (2013.01); *B03C 1/01* (2013.01);
(Continued)

(58) Field of Classification Search
CPC ... B03C 1/0332; B03C 1/288; B03C 2201/18; B03C 2201/22; B03C 2201/26;
(Continued)

(56) References Cited

U.S. PATENT DOCUMENTS

| 4,087,358 A | * | 5/1978 | Oder | ...................... | B01D 35/06 |
| | | | | | 209/214 |
| 5,705,059 A | | 1/1998 | Miltenyi | | |

(Continued)

FOREIGN PATENT DOCUMENTS

WO 2009132151 10/2009

OTHER PUBLICATIONS

Adams et al., Integrated acoustic and magnetic separation in microfluidic channels, Applied Physics Letters, 2009, 254103, vol. 95.
(Continued)

*Primary Examiner* — Molly K Devine
(74) *Attorney, Agent, or Firm* — Bing K. Yen

(57) ABSTRACT

A process for magnetically sorting biological objects includes the steps of applying a magnetic field generated by a magnetic assembly to a flexible conduit; flowing a sample fluid containing magnetically labeled biological objects through the flexible conduit to collect the magnetically labeled biological objects on a conduit wall; removing the magnetic field from the flexible conduit; and mechanically deforming the flexible conduit to loosen the magnetically labeled biological objects collected on the conduit wall.

16 Claims, 15 Drawing Sheets

Related U.S. Application Data of application No. 18/072,362, filed on Nov. 30, 2022, which is a continuation-in-part of application No. 16/729,398, filed on Dec. 29, 2019, now Pat. No. 11,571,696, which is a continuation-in-part of application No. 15/911,115, filed on Mar. 3, 2018, now Pat. No. 12,145,151.

(60) Provisional application No. 63/406,437, filed on Sep. 14, 2022.

(51) Int. Cl.
  B03C 1/01 (2006.01)
  B03C 1/033 (2006.01)
  H01F 7/02 (2006.01)

(52) U.S. Cl.
  CPC ......... B03C 1/0332 (2013.01); H01F 7/0205 (2013.01); *B01L 2200/0652* (2013.01); *B01L 2300/123* (2013.01); *B01L 2400/0439* (2013.01); *B03C 2201/18* (2013.01); *B03C 2201/26* (2013.01)

(58) Field of Classification Search
  CPC ............... B01L 3/505; B01L 3/502761; B01L 2300/123; B01L 2400/0433; B01L 2400/0481
  USPC ........................................................ 209/214
  See application file for complete search history.

(56) References Cited

U.S. PATENT DOCUMENTS

| | | | |
|---|---|---|---|
| 5,711,871 A | 1/1998 | Miltenyi | |
| 6,254,830 B1 | 7/2001 | Pivarnik et al. | |
| 6,417,011 B1 | 7/2002 | Miltenyi | |
| 6,602,422 B1 | 8/2003 | Miltenyi et al. | |
| 7,148,778 B2 * | 12/2006 | Humphries | B03C 1/288 |
| | | | 436/526 |
| 7,348,185 B2 | 3/2008 | Yamamichi | |
| 7,474,184 B1 | 1/2009 | Humphries et al. | |
| 7,781,202 B2 | 8/2010 | Yamamichi | |
| 8,114,683 B2 | 2/2012 | Zhou | |
| 8,513,029 B2 | 8/2013 | Zhou | |
| 8,636,906 B2 | 1/2014 | Stein | |
| 8,956,536 B2 | 2/2015 | Yu et al. | |
| 8,986,944 B2 | 3/2015 | Yamanishi et al. | |
| 9,217,131 B2 | 12/2015 | Lamish et al. | |
| 9,513,205 B2 | 12/2016 | Yu et al. | |
| 9,551,643 B2 | 1/2017 | Warner et al. | |
| 9,835,540 B2 | 12/2017 | Yu et al. | |
| 9,885,642 B2 | 2/2018 | Yu | |
| 10,045,913 B2 | 8/2018 | Warner et al. | |
| 10,444,125 B2 | 10/2019 | Yu | |
| 10,677,695 B2 | 6/2020 | Koyata et al. | |
| 2006/0240572 A1 | 10/2006 | Carron et al. | |
| 2007/0182517 A1 | 8/2007 | Humphries et al. | |
| 2008/0302732 A1 | 12/2008 | Soh et al. | |
| 2009/0065359 A1 | 3/2009 | Zhou | |
| 2010/0317093 A1 | 12/2010 | Turewicz et al. | |
| 2012/0100546 A1 | 4/2012 | Lowery et al. | |
| 2012/0122731 A1 | 5/2012 | Soh et al. | |
| 2012/0295302 A1 | 11/2012 | Lamish et al. | |
| 2013/0265054 A1 | 10/2013 | Lowery et al. | |
| 2013/0266944 A1 | 10/2013 | Neely et al. | |
| 2013/0330739 A1 | 12/2013 | Yu | |
| 2014/0120570 A1 | 5/2014 | Yu et al. | |
| 2015/0010939 A1 | 1/2015 | Warner et al. | |
| 2015/0177111 A1 | 6/2015 | Warner et al. | |
| 2016/0252445 A1 | 9/2016 | Yu et al. | |

OTHER PUBLICATIONS

Benez et al., Detection of circulating melanoma cells by immunomagnetic cell sorting, Journal of Clinical Laboratory Analysis, 1999, 229-233, vol. 13.

Ilnuma et al., Detection of tumor cells in blood using CD45 magnetic cell separation followed by nested mutant allele-specific amplification of p53 and K-ras genes in patients with colorectal cancer, International Journal of Cancer, 2000, 337-344, vol. 89.

Xia et al., Combined microfluidic-micromagnetic separation of living cells in continuous flow, Biomedical Microdevices, 2006, 299-308, vol. 8.

Pamme et al., Continuous sorting of magnetic cells via on-chip free-flow magnetophoresis, Lab on a Chip, 2006, 974-980, vol. 6.

* cited by examiner

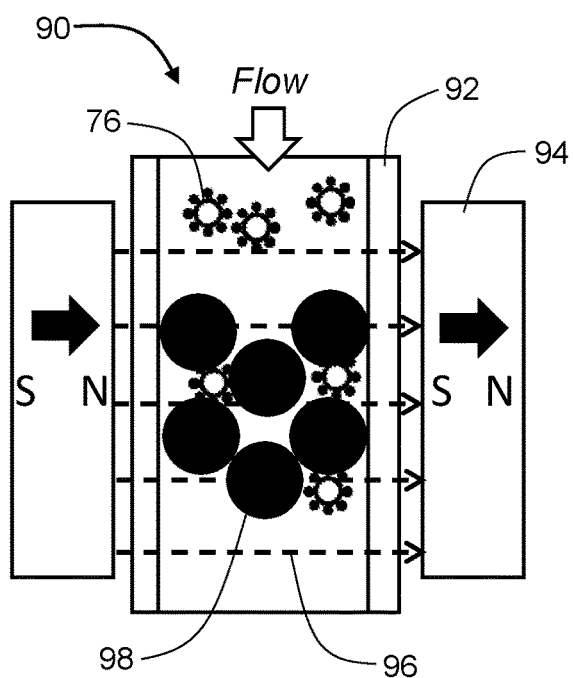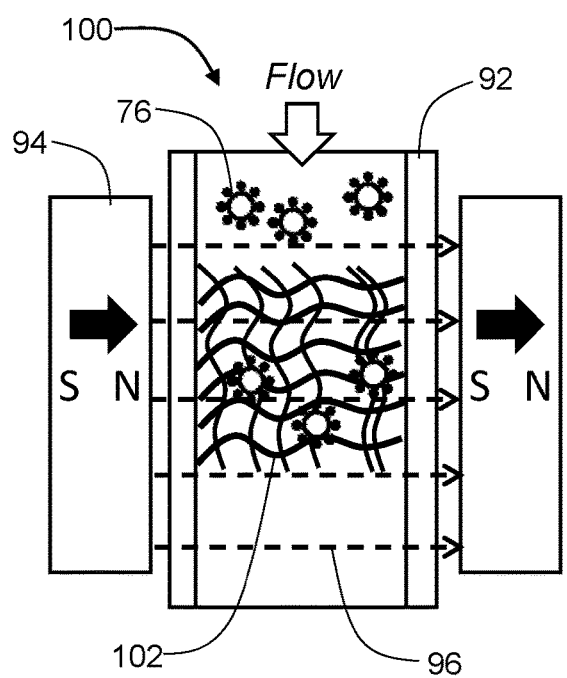
FIG. 5A (PRIOR ART)
FIG. 5B (PRIOR ART)

METHOD AND APPARATUS FOR MAGNETICALLY SORTING BIOLOGICAL OBJECTS

CROSS-REFERENCE TO RELATED APPLICATIONS

The present application is a continuation-in-part of application Ser. No. 18/111,486, filed on Feb. 17, 2023, which is a continuation-in-part of application Ser. No. 18/072,362, filed on Nov. 30, 2022, which claims priority to provisional application No. 63/406,437, filed on Sep. 14, 2022, and is a continuation-in-part of application Ser. No. 16/729,398, filed on Dec. 29, 2019, which is a continuation-in-part of application Ser. No. 15/911,115, filed on Mar. 3, 2018. All of these applications are incorporated herein by reference in their entirety, including their specifications.

BACKGROUND OF THE INVENTION

The present invention relates to separation and sorting of biological objects, and more particularly, to a method and apparatus for magnetically sorting biological objects.

The separation and sorting of biological objects or cells is critical to various biomedical applications, such as diagnostics and therapeutics. Biological objects may be sorted based on their respective physical properties, such as size and density, and biochemical properties, such as surface antigen expression.

In a biological object sorting process effectuated by an applied magnetic field, the biological object, such as a cell, which is typically nonmagnetic, can be magnetized for magnetic sorting purpose by attaching antibody-conjugated magnetic beads thereto, a process commonly known as magnetic labeling. FIG. 1A shows a cell 50 including a plurality of surface markers or antigens 52 on the cell surface thereof, and a plurality of antibody-conjugated magnetic beads 54 suspended in a fluid. Each of the antibody-conjugated magnetic beads 54 includes a magnetic entity 56 conjugated with one or more antibodies or other ligands 58, such as peptides and aptamers, that correspond to the surface markers 52. After an incubation period, the magnetic beads 54 may be directly attached to the cell 50 via the antigen-antibody interaction to form a magnetically labeled cell as shown in FIG. 1B, in a process known as direct labeling.

Alternatively, magnetic beads may be attached to a cell through an indirect labeling process. FIG. 2A shows a cell 50 including a plurality of surface markers or antigens 52 on the cell surface thereof, a plurality of intermediary links 60, and a plurality of magnetic beads 62 suspended in a fluid. Each of the intermediary links 60 includes one or more linking molecules 64, such as biotin or phycoerythrin (PE), conjugated to a primary antibody 66 that corresponds to the surface markers 52 of the cell 50. Each of the magnetic beads 62 includes a magnetic entity 56 conjugated with one or more secondary antibodies or ligands 68, such as streptavidin, that target the linking molecules 64. After an incubation period, the intermediary links 60 may attach to the cell 50 via the antigen-antibody interaction, and the magnetic beads 62 may further attach to the intermediary links 60 via PE-antibody, biotin-streptavidin, or other types of interactions, thereby forming a magnetically labeled cell as shown in FIG. 2B.

The magnetic beads 54 and 62 should ideally exhibit no magnetic moment in the absence of an applied magnetic field, thereby making the labeled cells indistinguishable from other biological objects in a cell suspension. As such, the magnetic entity 56 of the magnetic beads 54 and 62 normally consists of a magnetic nanoparticle or an aggregate of magnetic nanoparticles encapsulated in a nonmagnetic matrix because a magnetic particle may exhibit superparamagnetism as its size is reduced to tens of nanometers. In a sufficiently small ferromagnetic (e.g., iron) or ferrimagnetic (e.g., iron oxide) nanoparticle that exhibits superparamagnetism, magnetization can randomly flip direction under the influence of temperature. The typical time period between two such consecutive flips is known as the Neel relaxation time, or simply the relaxation time. Therefore, when the time period used to measure the magnetization of the magnetic nanoparticle is longer than the relaxation time thereof, the magnetic nanoparticle would appear to be nonmagnetic in the absence of an external magnetic field. During a cell sorting process, the magnetic nanoparticles of the magnetically labeled cells are first magnetized by sufficiently high magnetic field generated by a magnetic separator device and then attracted to regions of high magnetic field gradient.

After cells in sample fluid are magnetically labeled, they can be sorted or separated from the other non-labeled cells or biological objects in the sample fluid by a magnetic separator device. FIG. 3A shows a conventional magnetic separator device 70 comprising a container vessel 72 for holding static sample fluid 74 that contains the magnetically labeled cells 76 and a permanent magnet 78 placed in close proximity to a wall of the container vessel 72. The permanent magnet 78 generates a magnetic field in the container vessel 72 with the magnetic field gradient pointing towards the permanent magnet 78. After sufficient time, the magnetically labeled cells 76 will be gradually pulled by the force produced by the magnetic field towards the vessel wall and form an aggregate at the vessel wall, as shown in FIG. 3B. Because the magnetic field strength rapidly decreases as the distance from the permanent magnet 78 increases, the size of the vessel 72 and the sample fluid volume will be adversely limited.

FIG. 4 illustrates another conventional magnetic separator device 80 that separates magnetically labeled cells in static sample fluid contained in one or more wells 82. The magnetic device 80 uses multiple ferromagnetic poles 84, each of which has a trapezoidal tip, to act as a guide to concentrate the magnetic flux generated by multiple permanent magnets 86 attached thereto to increase the magnetic field strength and gradient near their tips. The corresponding magnetic field distribution, as delineated by magnetic field lines 88, shows that the magnetic field is strongest between the side surfaces of adjacent trapezoidal tips, as indicated by the small spacing between the field lines 88. By contrast, the magnetic field is much weaker above the pole tips, as indicated by the large spacing between the field lines 88. Accordingly, this necessitates the bottom portion of each well 82 to be disposed between the side surfaces of the pole tips, where the magnetic field is strong. The magnetically labeled cells in the conical-shaped wells 82 will be collected or condensed on or near the bottom of the wells 82 adjacent to the side surfaces of the trapezoidal tips of the ferromagnetic poles 84. Compared with the magnetic separator device 70 utilizing only the permanent magnet 78, the magnetic separator device 80 may improve the magnetic field strength and gradient by using the ferromagnetic poles 84 to concentrate the magnetic flux. Both devices 70 and 80, however, are designed to treat static sample fluid and thus may have limited throughput.

FIG. 5A illustrates a conventional magnetic separator device 90 that separates the magnetically labeled cells 76 as the sample fluid flows through the device 90. The device 90 includes a conduit 92 disposed between a pair of permanent magnets 94 that generate a magnetic field 96 across the conduit 92. The conduit 92 is filled with a column of porous aggregate of ferromagnetic or ferrimagnetic particles or spheres 98 that may be magnetized by the magnetic field 96 and produce relatively strong localized magnetic field and field gradient in small gaps between the particles or spheres 98, thereby magnetizing the magnetically labeled cells 76 and attracting them to the surface of the particles or spheres 98. Compared with the magnetic beads attached to the magnetically labeled cells 76, the ferromagnetic or ferrimagnetic particles or spheres 98 are much larger and may produce remanent magnetization after the permanent magnets 94 are removed from the conduit 92. The remanent magnetization may prevent or hinder the detachment of the magnetically labeled cells 76 from the surface of the particles or spheres 98 even after the removal of the magnetic field 96. While the magnetic separator device 90 may operate in a continuous flow manner and thus may potentially have a higher throughput than the magnetic separators 70 and 80 that operate in a static manner, the recovery of the magnetically labeled cells in certain applications (e.g., positive selection process where the magnetically labeled cells are the target cells) may be lower without vigorously flushing the conduit 92 with pressurized fluid to dislodge the magnetically labeled cells 76 from the surface of the particles or spheres 98, which may damage the same cells 76.

The column of porous aggregate of soft magnetic particles or spheres 98 in the conduit 92 may be replaced by one or more meshes 102 made of a ferromagnetic or ferrimagnetic material as shown in FIG. 5B. The magnetic separator device 100 may reduce the remanent magnetization encountered in the device 90 because the wires in the mesh 102 have smaller dimensions than the ferromagnetic or ferrimagnetic particles or spheres 98. However, the larger opening between adjacent wires in the mesh 102 may also weaken the localized magnetic field, thereby decreasing the device throughput. Both column-based devices 90 and 100 may introduced unwanted contaminants into the sample fluid as it flows through the ferromagnetic or ferrimagnetic material in the conduit 92.

FIG. 6 shows another magnetic separator device 104, which operates in a continuous flow manner without using a column of porous aggregate of ferromagnetic or ferrimagnetic material, thereby obviating the potential contamination and recovery issues associated therewith. The column-free device 104 includes a conduit 106 surrounded by a radial array of ferromagnetic poles 108 that conduct magnetic flux from a plurality of permanent magnets 110 and 112. The sample fluid flows through the conduit 106 along a direction perpendicular to the figure. The magnetic separator device 104 essentially rearranges the linear array of the ferromagnetic poles 84 of the static magnetic separator device 80 in a radial manner to create a magnetic periodic field at the center of the radially arranged ferromagnetic poles 108 and permanent magnets 110 and 112. Like the static device 80 shown in FIG. 4, the corresponding magnetic field distribution generated by the device 104, as delineated by magnetic field lines 114 between the trapezoidal tips of the ferromagnetic poles 108, shows that the magnetic field is strongest between the side surfaces of adjacent trapezoidal tips, as indicated by the small spacing between the field lines 114, and much weaker above the pole tips (i.e., inside the conduit 106), as indicated by the large spacing between the field lines 114. However, unlike the wells 82 that extend into the regions between the side surfaces of two adjacent trapezoidal tips, the conduit 106 of the magnetic separator device 104 does not extend into such regions, thereby making the magnetic field in the conduit 106 considerably weaker. This is further exacerbated by the limited time exposed to the magnetic field as the sample fluid flows through the conduit 106.

The use of a column-free magnetic separator device, such as the magnetic separator device 104 shown in FIG. 6, however, does not necessarily obviate the difficulties in recovering the magnetically labeled cells accumulated on the conduit wall in the absence of the applied magnetic field. This is because while individual magnetic beads 54/62 may exhibit superparamagnetic behavior, they collectively become a much larger magnetic entity with multiple magnetic domains when the cells are clumped together on the conduit wall. After the applied magnetic field is removed from the conduit, each magnetic bead 54/62 may still experience magneto-static field from numerous neighboring magnetic beads 54/62 attached to the same cell or adjacent cells, thereby significantly increasing the magnetic stability and reducing the effect of thermal agitation (i.e., longer relaxation time) for the overall magnetic entity. Accordingly, it may take a prolonged period of time for the accumulated cells on the conduit wall to self-demagnetize and dissociate after the applied magnetic field is removed, which may significantly decrease the process throughput. While it is possible to expedite the dissociation process of the accumulated cells on the conduit wall by flushing the conduit with pressurized fluid, such method may damage cells and may be extremely inefficient since most of the fluid may simply flow through the conduit without coming into contact with the accumulated cells on the conduit wall, resulting in excessive dilution that may require additional concentration steps to remove the excess fluid.

For the foregoing reasons, there is a need for a method and apparatus for magnetically sorting biological objects that can efficiently extract and recover magnetically labeled biological objects from a sample fluid while minimizing potential contamination.

SUMMARY OF THE INVENTION

The present invention is directed to a method that satisfies this need. A method having features of the present invention for magnetically sorting biological objects includes the steps of applying a magnetic field generated by a magnetic assembly to a flexible conduit; flowing a sample fluid including magnetically labeled biological objects through the flexible conduit to collect the magnetically labeled biological objects on a conduit wall; removing the magnetic field from the flexible conduit; and mechanically deforming the flexible conduit to loosen the magnetically labeled biological objects collected on the conduit wall.

BRIEF DESCRIPTION OF DRAWINGS

These and other features, aspects, and advantages of the present invention will become better understood with regard to the following description, appended claims, and accompanying drawings where:

FIGS. 5A and 5B illustrate two conventional magnetic separator devices that utilize a conduit filled with a column of ferromagnetic or ferrimagnetic objects for sorting magnetically labeled cells flowing through the column;

For purposes of clarity and brevity, like elements and components will bear the same designations and numbering throughout the Figures, which are not necessarily drawn to scale.

DETAILED DESCRIPTION OF THE INVENTION

Figures 1A, 1B:
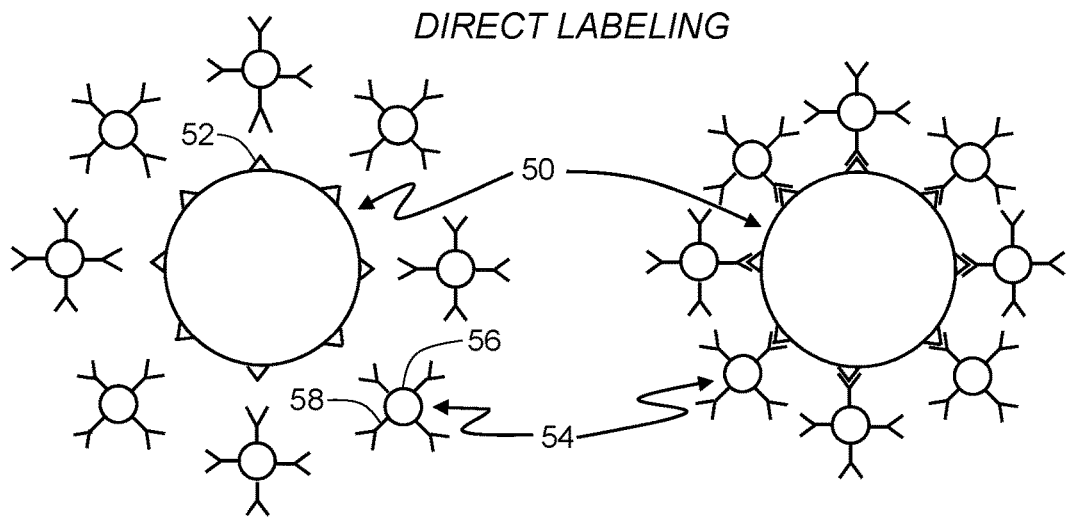
FIGS. 1A and 1B illustrate formation of a magnetically labeled cell by direct labeling process.
Figures 2A, 2B:
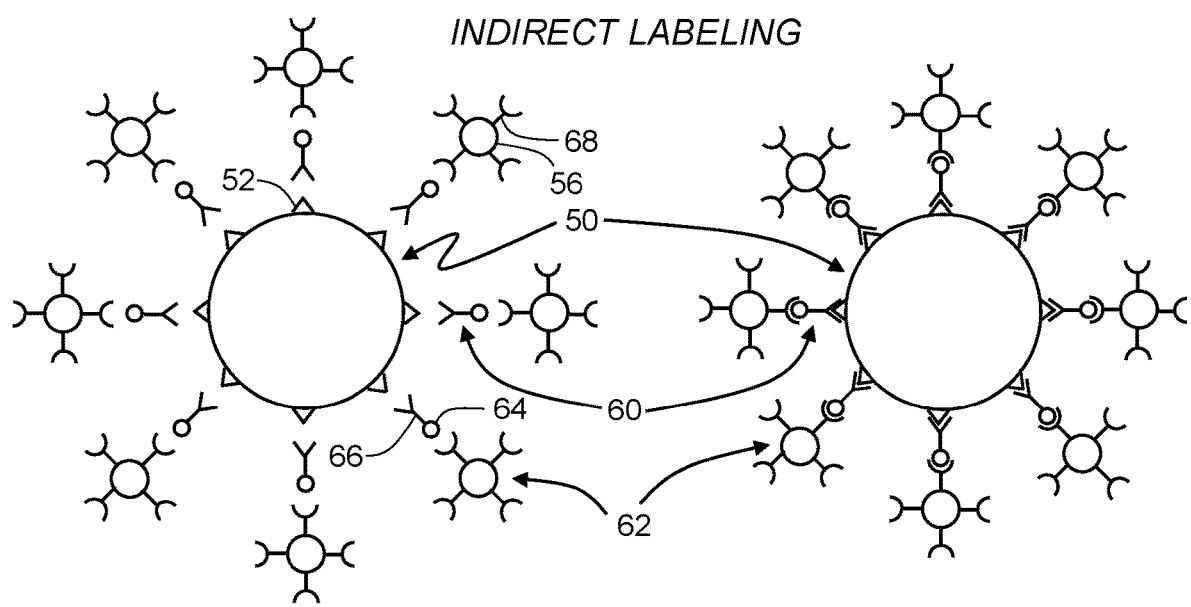
FIGS. 2A and 2B illustrate formation of a magnetically labeled cell by indirect labeling process.
Figure 3A:
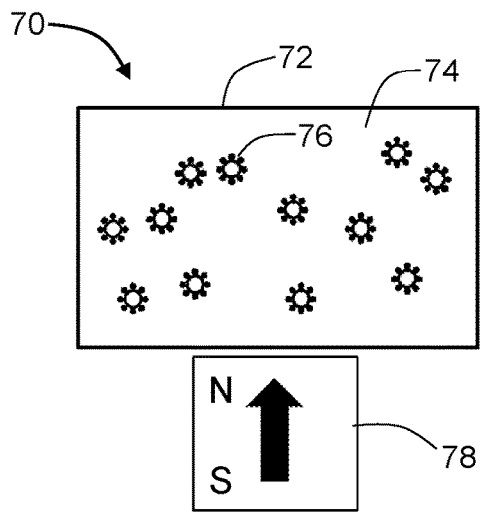
FIGS. 3A and 3B illustrate sorting of magnetically labeled cells by a conventional static magnetic separator device.
Figure 3B:
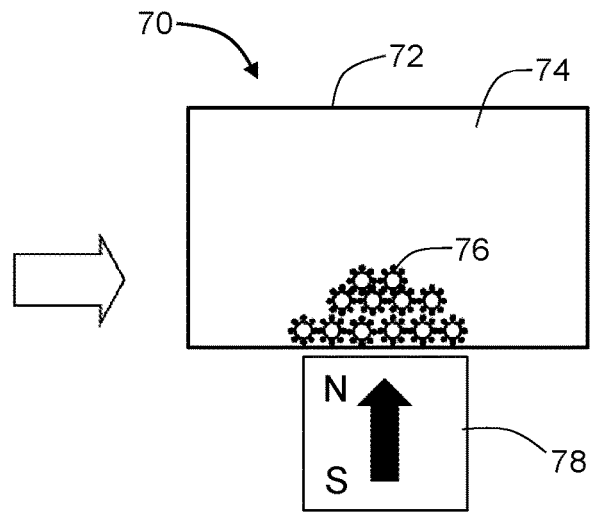
Figure 4:
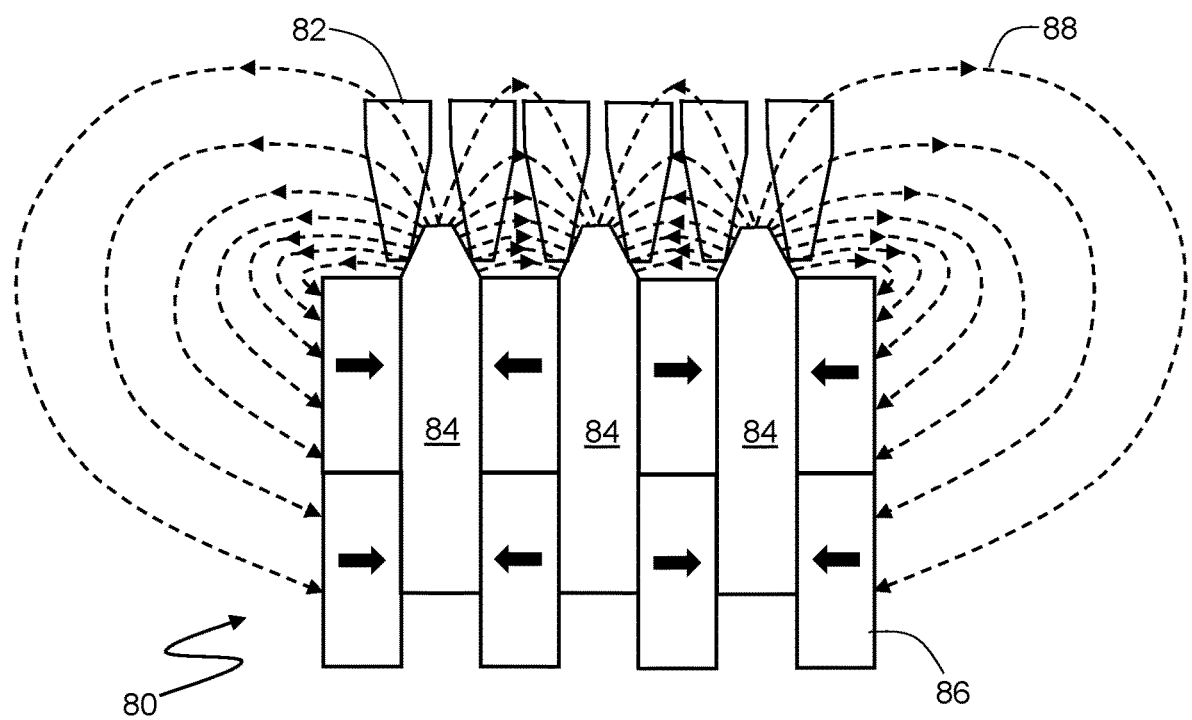
FIG. 4 illustrates another conventional magnetic separator device for sorting magnetically labeled cells in static sample fluid.
Figure 6:
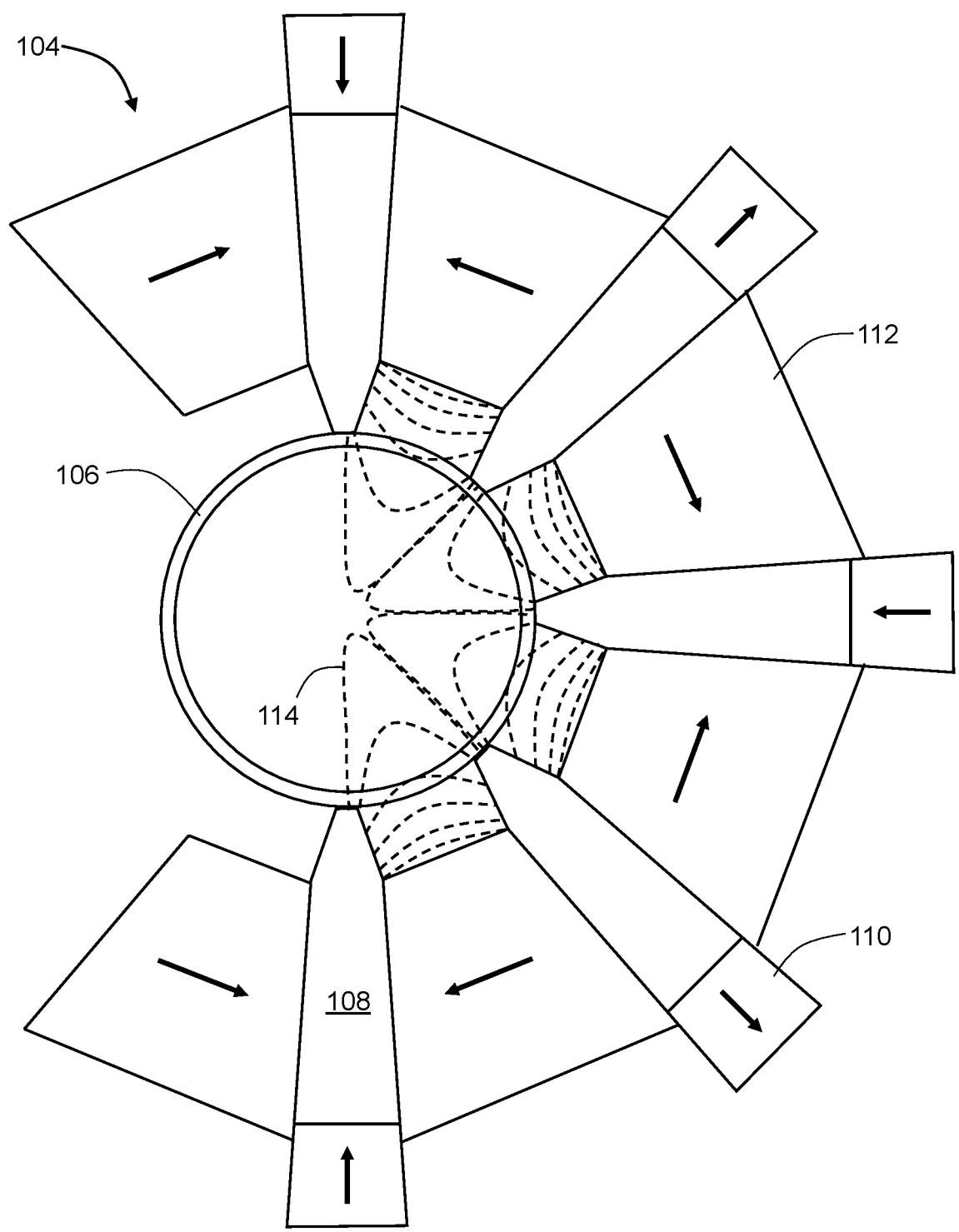
FIG. 6 is a cross-sectional view corresponding to a magnetic separator device for sorting magnetically labeled cells flowing through a conduit.

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "biological objects" may be used herein to include cells, bacteria, viruses, molecules, particles including RNA and DNA, cell cluster, bacteria cluster, molecule cluster, and particle cluster.

The term "biological sample" may be used herein to include blood, body fluid, tissue extracted from any part of the body, bone marrow, hair, nail, bone, tooth, liquid and solid from bodily discharge, or surface swab from any part of body. "Fluid sample," or "sample fluid," or "liquid sample," or "sample solution" may include a biological sample in its original liquid form, biological objects being dissolved or dispersed in a buffer liquid, or a biological sample dissociated from its original non-liquid form and dispersed in a buffer fluid. A buffer fluid is a liquid into which biological objects may be dissolved or dispersed without introducing contaminants or unwanted biological objects. Biological objects and biological sample may be obtained from human or animal. Biological objects may also be obtained from plants and environment including air, water, and soil. A sample fluid may contain various types of magnetic or optical labels, or one or more chemical reagents that may be added during various process steps.

The term "sample flow rate" or "flow rate" may be used herein to represent the volume amount of a fluid flowing through a cross section of a channel, or a conduit, or a fluidic part, or a fluidic path in a unit time.

The term "relative fraction" may be used herein to represent the ratio of a given quantity of biological objects or particles to the total quantity of all biological objects or particles present in a sample fluid.

In the art of cell sorting or enrichment, the target population of biological objects is referred to as the "specific" objects of interest and those biological objects that are isolated, but are not desired, are termed "non-specific." The term "purity" describes the concentration or relative fraction of target or specific biological objects of interest and is quantified by the number of target biological objects divided by the total number of biological objects expressed in percentage. The term "recovery ratio" describes the sorting efficiency of biological objects and is quantified by the number of target biological objects recovered after sorting divided by the number of target biological objects present in the initial sample expressed in percentage.

According to an embodiment of the present invention as applied to a flow-through magnetic sorting process, a sample fluid containing magnetically labeled and unlabeled biological objects is flowed through a conduit that is exposed to one or more magnetic fields generated by one or more magnetic assemblies, respectively. The magnetic field(s) may magnetize the magnetically labeled biological objects and attract the magnetized biological objects to deposit on the conduit wall while allowing magnetically unlabeled biological objects to flow unimpeded through the conduit.

Various magnetic separator devices, such as but not limited to any of those disclosed in U.S. application Ser. No. 16/729,398, which is incorporated herein by reference, may be employed to deposit magnetically labeled biological objects on the conduit wall during the magnetic sorting process. For example and without limitation, FIG. 7 is a perspective view of one such magnetic separator device 120 including a magnetic assembly 122 for generating a magnetic field, a conduit 124 made of a pliable and/or flexible material for flowing a sample fluid for sorting, and a holder 126 for supporting the conduit 124.

The magnetic assembly 122 includes a magnetic flux source, which comprises a permanent magnet 128, and first and second magnetic flux guides 130 and 132 for conducting the magnetic flux from the magnetic flux source and emitting a magnetic field for attracting the magnetically labeled biological objects to deposit on the conduit wall. The first magnetic flux guide 130 has a first base 134 collecting magnetic flux and a first tip 136 having a tapering shape and emitting the magnetic field. The second magnetic flux guide 132 has a second base 138 collecting magnetic flux and a second tip 140 having a tapering shape and emitting the magnetic field. The first and second magnetic flux guides 130 and 132 may be parallel at their bases 134 and 138 and bent with their tips 136 and 140 arched or bent over the permanent magnet 128 disposed between the first and second bases 134 and 138. The first and second bases 134 and 138 are physically and/or magnetically coupled to the permanent magnet 128 at its two poles (e.g., North and South poles), respectively, for conducting the magnetic flux from the permanent magnet 128, thereby generating opposite magnetic polarities on the first and second tips 136 and 140, respectively. The first magnetic flux guide 130 may have a smaller cross section, which may be defined herein as the cross-sectional area perpendicular to the flux flow, at the first tip 136 than the first base 134 in order to concentrate the magnetic flux collected from the permanent magnet 128 to the first tip 136. Similarly, the second tip 140 may have a smaller cross section than the second base 138 to concentrate the magnetic flux collected from the permanent magnet 128 to the second tip 140. Accordingly, each of the tips 136 and 140 may have a higher magnetic flux density than the corresponding base 134 or 138. The first and second tips 136 and 140 emit and shape the magnetic field in the vicinity of the gap therebetween from the concentrated magnetic flux.

Figure 7:
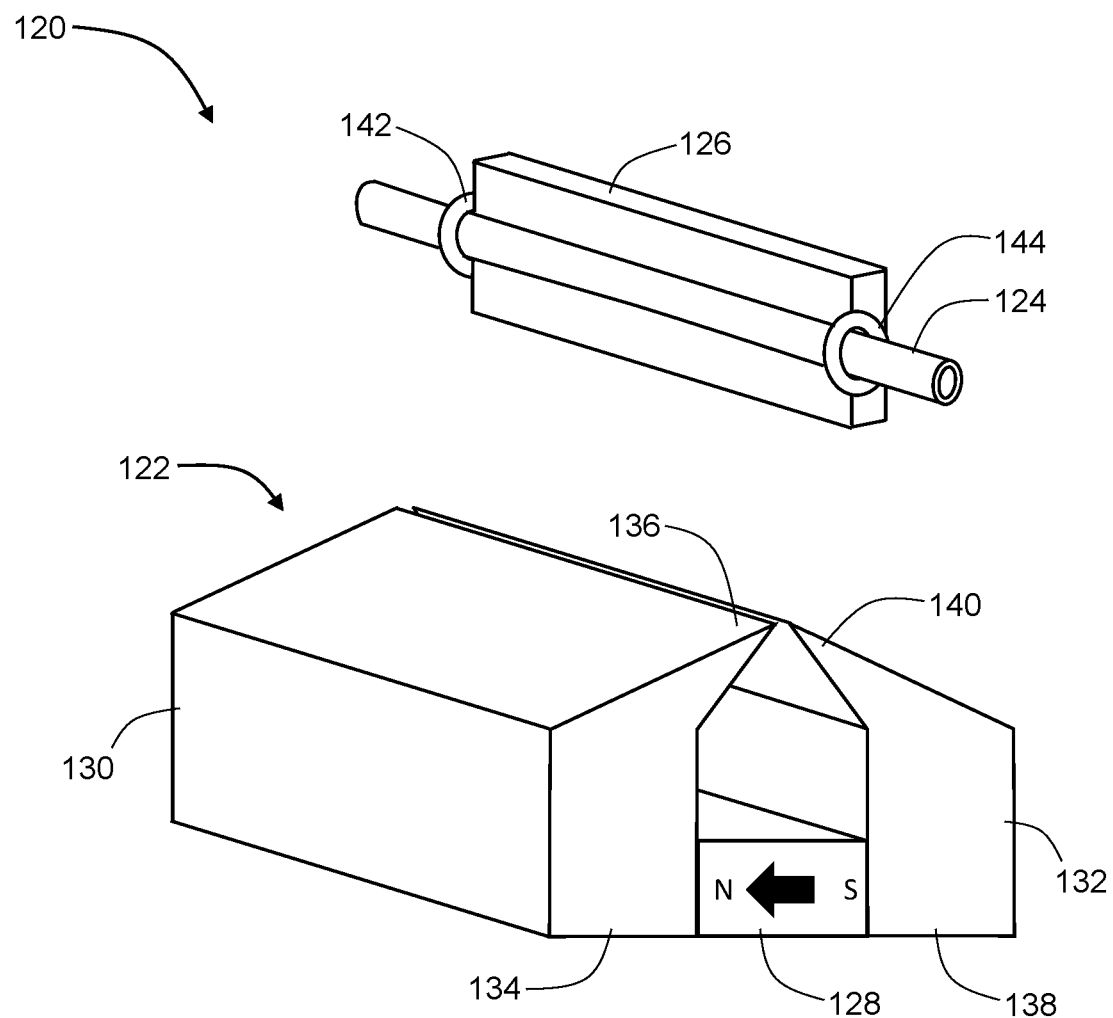
FIG. 7 is a perspective view of a magnetic separator device in accordance with an embodiment of the present invention that includes a conduit, a magnetic assembly for generating a magnetic field, and a holder for supporting the conduit.

With continued reference to FIG. 7, the conduit 124 may include two collars 142 and 144 attached thereto. The conduit 124 may be reversibly fastened to the holder 126 by snapping the collars 142 and 144 onto brackets or supports (not shown) at two ends of the holder 126. The conduit 124 may be stretched in between the collars 142 and 144 when fastened to the holder 126, thereby ensuring that the flexible conduit 124 remains straight and aligns to the first and second tips 136 and 140 when exposing the conduit 124 to the magnetic field.

Figure 8A:
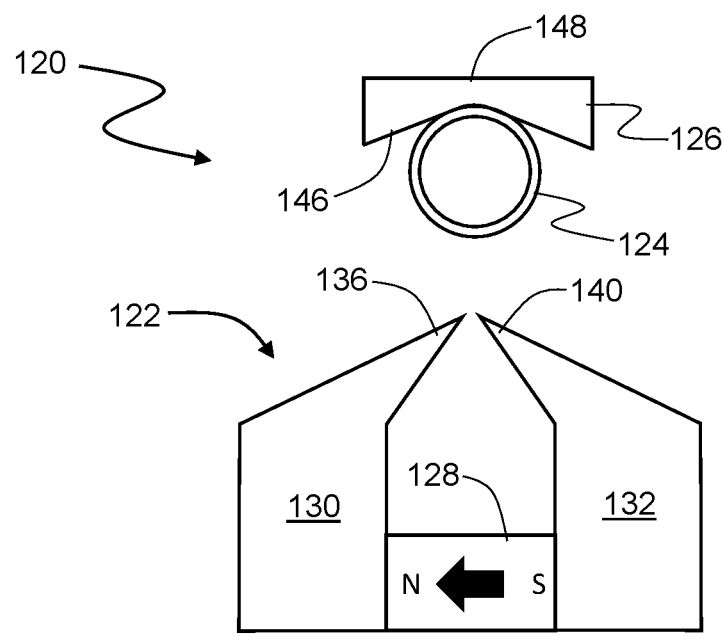
FIG. 8A is a cross-sectional view of the magnetic separator of FIG. 7 when the conduit is disengaged from the magnetic assembly.
Figure 8B:
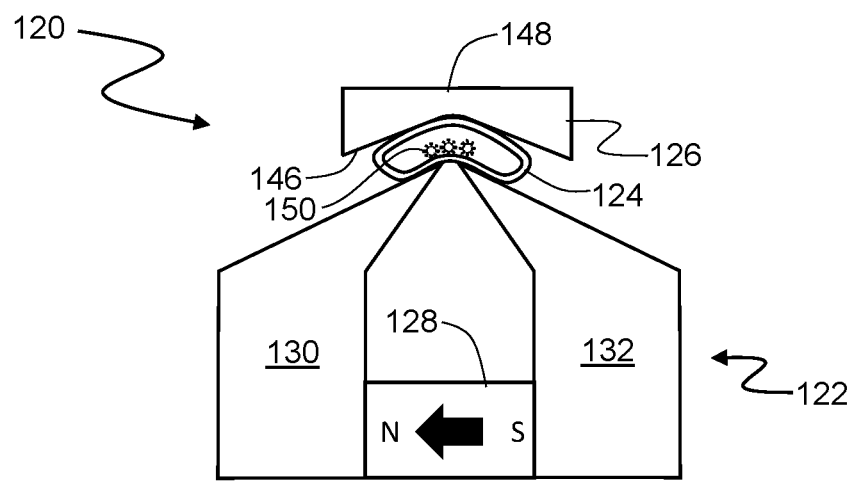
FIG. 8B is a cross-sectional view of the magnetic separator device of FIG. 7 when the conduit is pushed against the tips of the magnetic assembly during magnetic sorting process.

FIG. 8A is a cross-sectional view of the magnetic separator device 120 when the conduit 124 and the holder 126 are disengaged from the magnetic assembly 122. The holder 126 may have a first surface 146 facing the conduit 124 and a second surface 148 opposite the first surface 146. The first surface 146 may have a concave profile to accommodate the convex arch profile formed by the tips 136 and 140 of the magnetic flux guides 130 and 132 of the magnetic assembly 122 when the conduit 124 is squeezed between the holder 126 and the magnetic assembly 122 during the magnetic sorting process as shown in FIG. 8B. This allows the sample fluid flowing through the conduit 124 to come closer to the tips 136 and 140 because the magnetic field strength rapidly drops off away from the tips 136 and 140. During the magnetic sorting process, the magnetically labeled biological objects 150 may be deposited on the bottom of the conduit 124 near the gap between the tips 136 and 140, where the magnetic field gradient may be highest.

The first surface 146 may have other types of profiles, such as flat or convex, depending on the tip geometry of the magnetic flux guides 130 and 132 and the desired shape of the conduit 124 during the magnetic separation process.

Figure 9:
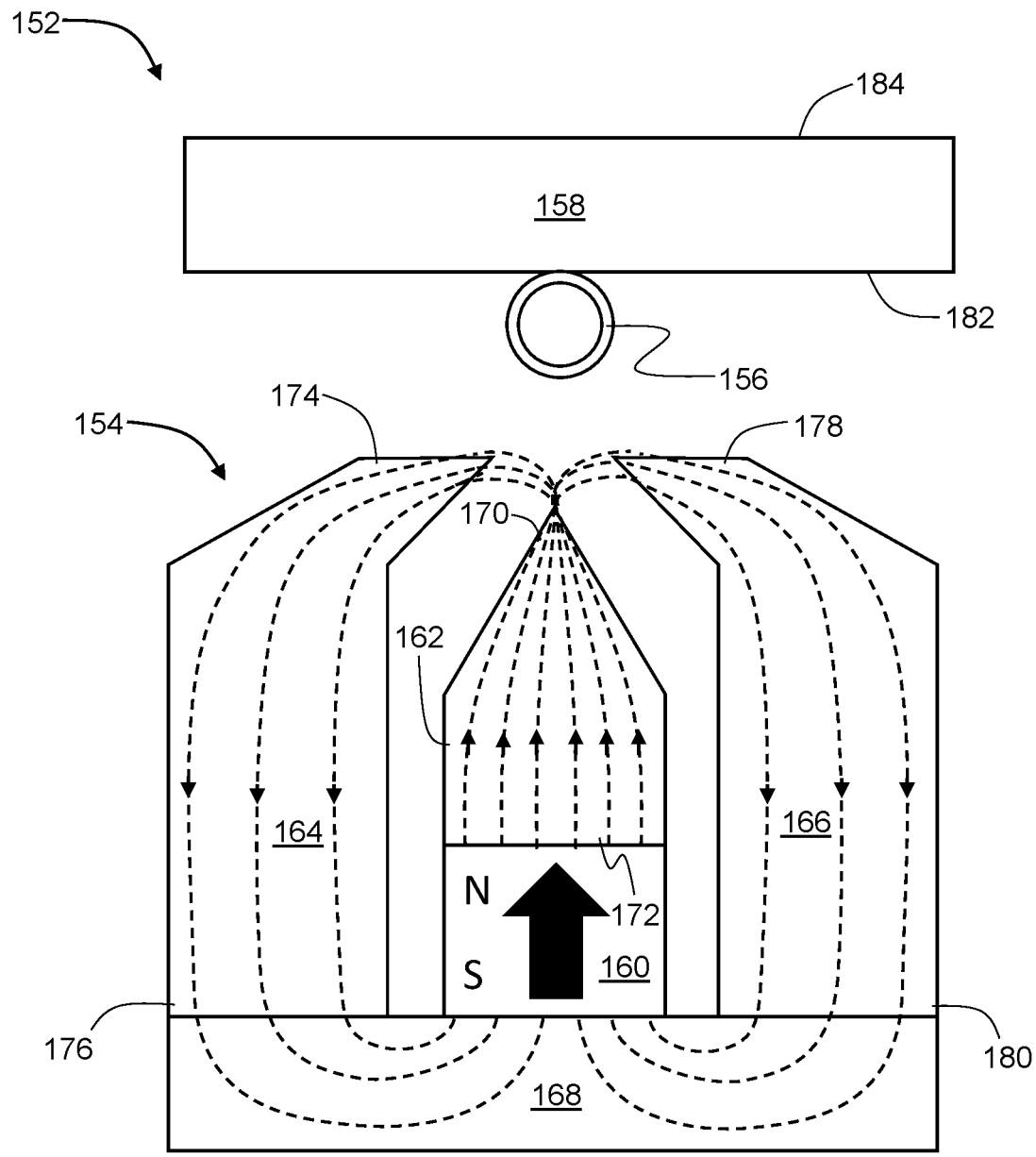
FIG. 9 is a cross-sectional view of another magnetic separator device when the conduit is disengaged from the magnetic assembly.

FIG. 9 is a cross-sectional view of another example of the magnetic separator device that may be employed to deposit magnetically labeled biological objects on the conduit wall during the magnetic sorting process. The magnetic separator device 152 includes a magnetic assembly 154 for generating a magnetic field, a conduit 156 made of a pliable and/or flexible material, and a holder 158 for supporting the conduit 156. The figure shows the magnetic separator device 152 when the conduit 156 and the holder 158 are disengaged from the magnetic assembly 154.

The magnetic assembly 154 includes a magnetic flux source, which comprises a permanent magnet 160, a center magnetic flux guide 162 for conducting the magnetic flux from the magnetic flux source and forming a magnetic field, first and second side magnetic flux guides 164 and 166 disposed on opposite sides of the center magnetic flux guide 162 for conducting the magnetic flux from the magnetic flux source and forming the magnetic field, and a bottom magnetic flux guide 168 for conducting magnetic flux between the magnetic flux source (e.g., the permanent magnet 160) and the first and second side magnetic flux guides 164 and 166.

The center magnetic flux guide 162 has a center tip 170 with a tapering shape and a center base 172 physically and/or magnetically coupled to the permanent magnet 160 at its first pole (e.g., North pole). The center tip 170 may have a smaller cross section, which may be defined herein as the cross-sectional area perpendicular to the magnetic flux flow, than the center base 172, thereby concentrating the magnetic flux from the center base 172 to the center tip 170. The first side magnetic flux guide 164 has a first side tip 174 with a tapering shape and a first side base 176 physically and/or magnetically coupled to one end of the bottom magnetic flux guide 168, which is physically and/or magnetically coupled to the permanent magnet 160 at its second pole (e.g., South pole). The first side tip 174 may have a smaller cross section than the first side base 176, thereby concentrating the magnetic flux from the first side base 176 to the first side tip 174. The second side magnetic flux guide 166 has a second side tip 178 with a tapering shape and a second side base 180 physically and/or magnetically coupled to the other end of the bottom magnetic flux guide 168, which is physically and/or magnetically coupled to the permanent magnet 160 at its second pole (e.g., South pole). The second side tip 178 may have a smaller cross section than the second side base 180, thereby concentrating the magnetic flux from the second side base 180 to the second side tip 178. Accordingly, each of the tips 170, 174, and 178 may have a higher magnetic flux density than the corresponding base 172, 176, or 180. The first and second side magnetic flux guides 164 and 166 may be parallel at their bases 176 and 180 and bending inward toward the center tip 170 at their tips 174 and 178. The first and second side tips 174 and 178 may be pointed at each other and positioned above the center tip 170. The bottom magnetic flux guide 168 conducts the magnetic flux from the permanent magnet 160 to the first and second side magnetic flux guides 164 and 166 and may be disposed beneath the first and second side magnetic flux guides 164 and 166 and the permanent magnet 160.

The center magnetic flux guide 162 is magnetically coupled to the permanent magnet 160 at its first pole while the first and second side magnetic flux guides 164 and 166 are magnetically coupled to the permanent magnet 160 at its second pole, thereby rendering the first and second side tips 174 and 178 and the center tip 170 to have opposite magnetic polarities and forming a strong magnetic field at or near the gaps between the tips 170, 174, and 178 to deposit the magnetically labeled biological objects on the conduit wall.

The holder 158 may have a first surface 182 facing the conduit 156 and a second surface 184 opposite the first surface 182. The first surface 182 may have a relatively flat profile for pushing the conduit 156 into the gap or concave space delineated by the tip ends of the three magnetic flux guides 162-166. Like the holder 126 shown in FIG. 7 and described above, the holder 158 may use an analogous collar/seat coupling at the two ends thereof (not shown) to secure the conduit 156 in an analogous manner.

Figure 10:
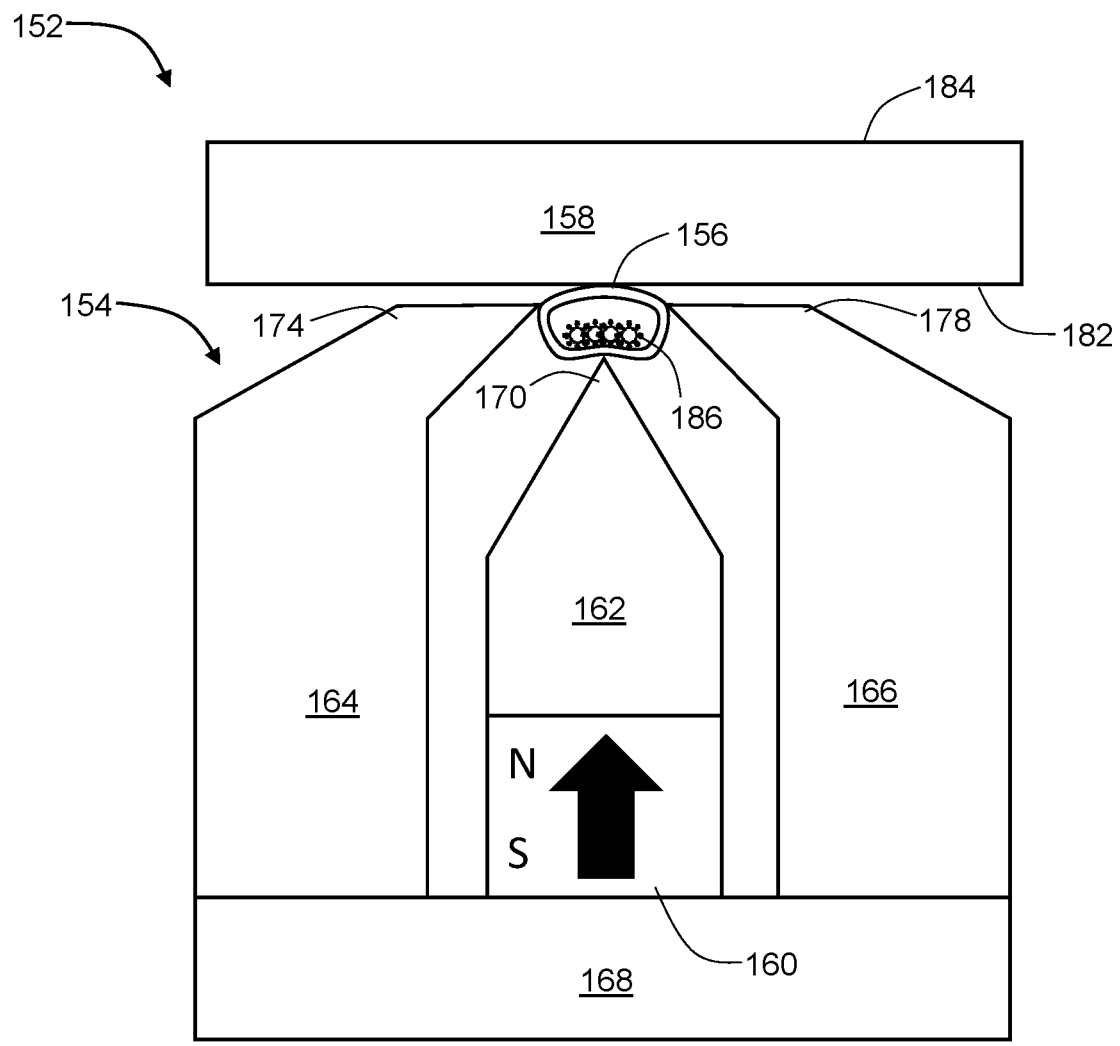
FIG. 10 is a cross-sectional view of the magnetic separator device of FIG. 9 when the conduit is pushed against the tips of the magnetic assembly during magnetic sorting process.

FIG. 10 is a cross-sectional view of the magnetic separator device 152 when the conduit 156 is squeezed between the holder 158 and the tip ends of the three magnetic flux guides 162-166 during the magnetic sorting process. The holder 158 may push the deformed or distorted conduit 156 further into the gap between the center tip 170 and the first side tip 174 and the gap between the center tip 170 and the second side tip 178, where the magnetic field may be the strongest. Pushing the conduit 156 into the gaps may expose more sample fluid flowing through the conduit 156 to stronger magnetic field. During the magnetic sorting process, the magnetically labeled biological objects 186 may be deposited on the bottom of the conduit 156 near the center tip 170, where the magnetic field gradient may be highest.

Figure 11:
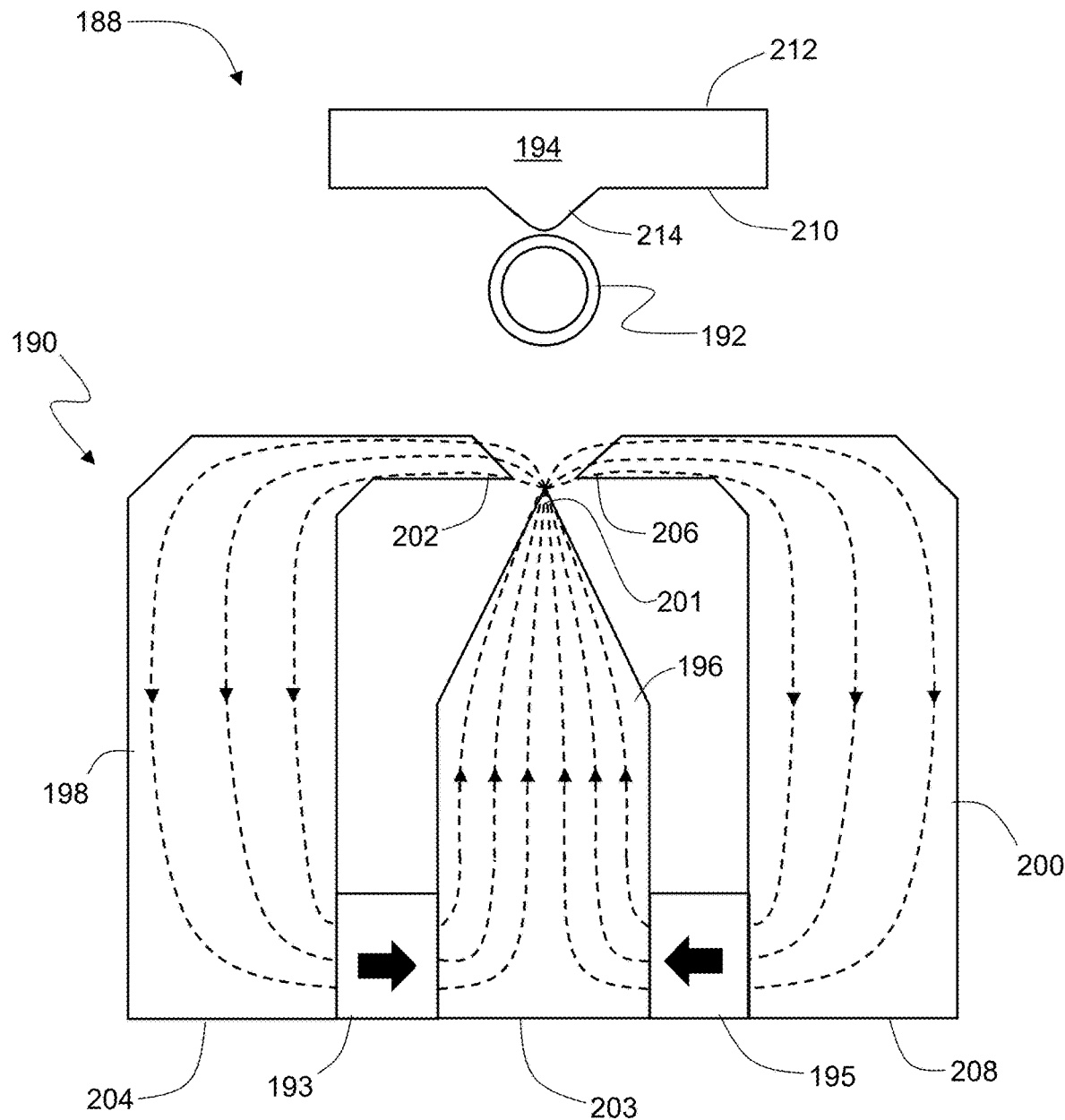
FIG. 11 is a cross-sectional view of still another magnetic separator device when the conduit is disengaged from the magnetic assembly.

Other magnetic separator devices, such as but not limited to any of those disclosed in U.S. application Ser. No. 18/072,362, which is incorporated herein by reference, may also be employed to deposit magnetically labeled biological objects on the conduit wall during the magnetic sorting process. For example and without limitation, FIG. 11 is a cross-sectional view of one such magnetic separator device 188 including a magnetic assembly 190 for generating a magnetic field, a conduit 192 made of a pliable and/or flexible material, and a holder 194 for supporting the conduit 192.

The magnetic assembly 190 includes a magnetic flux source, which comprises first and second permanent magnets 193 and 195, a center magnetic flux guide 196 for conducting the magnetic flux from the magnetic flux source and forming a magnetic field, first and second side magnetic flux guides 198 and 200 disposed on opposite sides of the center magnetic flux guide 196 for conducting the magnetic flux from the magnetic flux source and forming the magnetic field.

The center magnetic flux guide 196 has a center tip 201 with a tapering shape and a center base 203 physically and/or magnetically coupled to the first and second permanent magnets 193 and 195 at their first pole (e.g., North pole). The center tip 201 may have a smaller cross section, which may be defined herein as the cross-sectional area perpendicular to the magnetic flux flow, than the center base 203, thereby concentrating the magnetic flux from the center base 203 to the center tip 201. The first side magnetic flux guide 198 has a first side tip 202 and a first side base 204 physically and/or magnetically coupled to the first permanent magnet 193 at its second pole (e.g., South pole). The first side tip 202 may have a smaller cross section than the first side base 204, thereby concentrating the magnetic flux from the first side base 204 to the first side tip 202. The second side magnetic flux guide 200 has a second side tip 206 and a second side base 208 physically and/or magnetically coupled to the second permanent magnet 195 at its second pole (e.g., South pole). The second side tip 206 may have a smaller cross section than the second side base 208, thereby concentrating the magnetic flux from the second side base 208 to the second side tip 206. Accordingly, each of the tips 201, 202, and 206 may have a higher magnetic flux density than the corresponding base 203, 204, or 208. The first and second side magnetic flux guides 198 and 200 may be parallel at their bases 204 and 208 and bending or kinking inward toward the center tip 201 at their tips 202 and 206, which may be pointed at each other. The ends of the first and second side tips 202 and 206 may each have a chisel edge profile with the bevel side facing upward or outward away from the center magnetic flux guide 196. The center tip 201 may be positioned below the first and second side tips 202 and 206. The conduit 192 may be nestled in the gap or concave space delineated by the tip end of the center tip 201 and the bevels of the first and second side tips 202 and 206.

The first permanent magnet 193 may be disposed between the center base 203 and the first side base 204, and the second permanent magnet 195 may be disposed between the center base 203 and the second side base 208. The first and second permanent magnets 193 and 195 have opposite magnetization directions that may be oriented substantially perpendicular to the center magnetic flux guide 196.

The center base 203 is magnetically coupled to the first and second permanent magnets 193 and 195 at their first pole (e.g., North pole), while the first and second side bases 204 and 208 are magnetically coupled to the first and second permanent magnets 193 and 195 at their second pole (e.g., South pole), respectively, thereby rendering the first and second side tips 202 and 206 and the center tip 201 to have opposite magnetic polarities and forming a strong magnetic field at or near the gaps between the tips 201, 202, and 206 to deposit the magnetically labeled biological objects on the conduit wall. and 208 are magnetically coupled to the first and second permanent magnets 192 and 194 at their second pole (e.g., South pole), respectively, thereby rendering the first and second side tips 202 and 206 and the center tip 201 to have opposite magnetic polarities and forming a strong magnetic field at or near the gaps between the tips 201, 202, and 206 to deposit the magnetically labeled biological objects on the conduit wall.

The holder 194 may have a first surface 210 facing the conduit 192 and a second surface 212 opposite the first surface 210. The first surface 210 may have a ridge structure 214 protruded from the first surface 210 that functions as a press for pushing the conduit 192 into the gap or concave space delineated by the tip end of the center tip 201 and the bevels of the first and second side tips 202 and 206 during the magnetic sorting process. In an embodiment, the ridge structure 214 or the entire holder 194 may be made of a magnetic material that conducts magnetic flux like a magnetic flux guide. Like the holder 126 shown in FIG. 7 and described above, the holder 194 may use an analogous collar/seat coupling at the two ends thereof (not shown) to secure the conduit 192 in an analogous manner.

Figure 12:
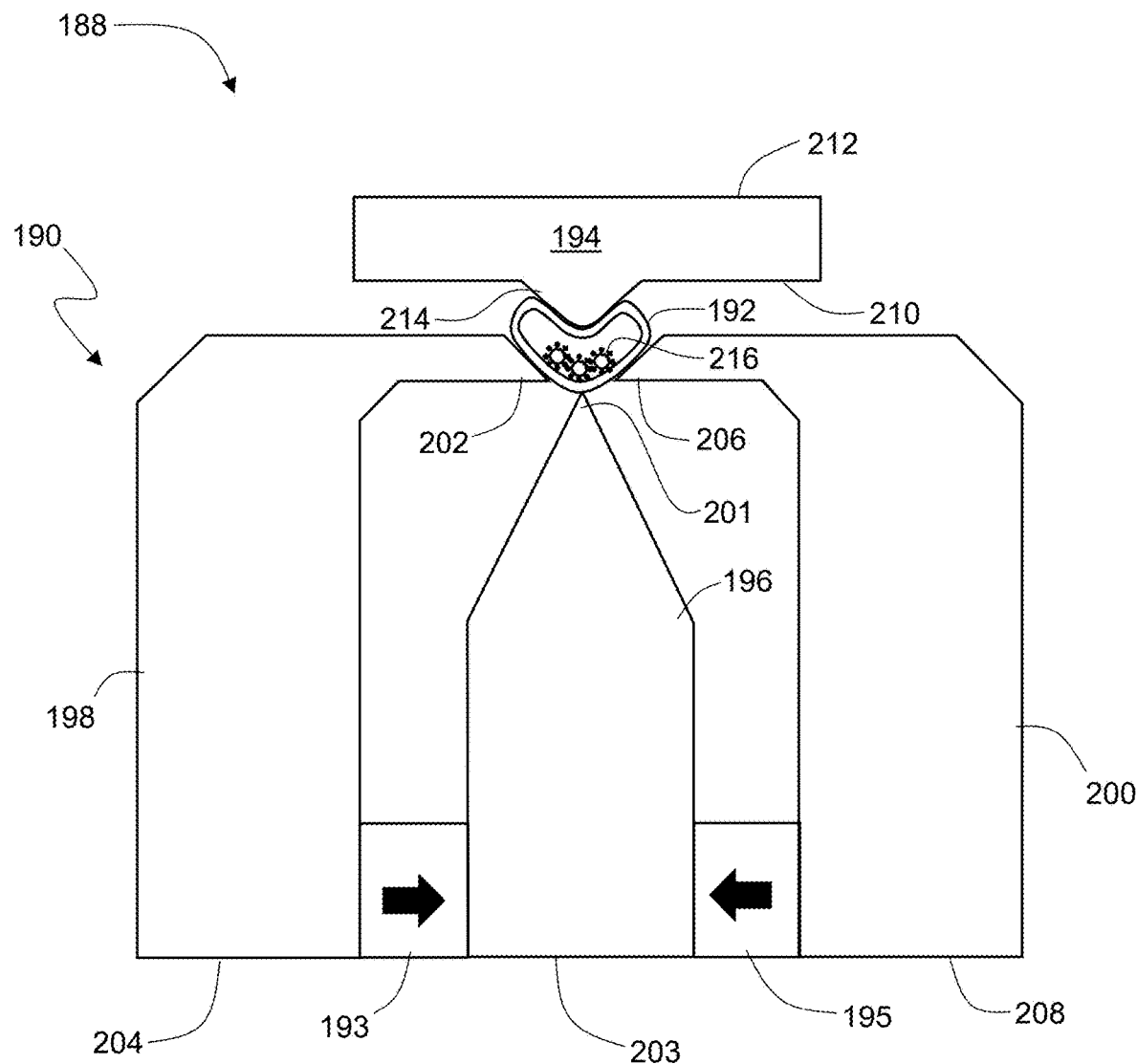
FIG. 12 is a cross-sectional view of the magnetic separator device of FIG. 11 when the conduit is pushed against the tips of the magnetic assembly during magnetic sorting process.

FIG. 12 is a cross-sectional view of the magnetic separator device 188 when the conduit 192 is squeezed between the ridge structure 214 of the holder 194 and the tip ends of the three magnetic flux guides 196-200 during the magnetic sorting process. The holder 194 may push the deformed or distorted conduit 192 further into the gap between the center tip 201 and the first side tip 202 and the gap between the center tip 201 and the second side tip 206, where the magnetic field may be the strongest. Pushing the conduit 192 against the tip end of the center tip 201 and the bevels of the first and second side tips 202 and 206 may expose more sample fluid flowing through the conduit 192 to stronger magnetic field. During the magnetic sorting process, the magnetically labeled biological objects 216 may be deposited on the bottom of the conduit 192 near the center tip 201, where the magnetic field gradient may be highest.

In the embodiment where the ridge structure 214 or the entire holder 194 is made of the magnetic material, the ridge structure 214 may magnetically interact with the tips 201, 202, and 206 to further enhance the magnetic field therebetween, thereby increasing the deposition of the magnetically labeled biological objects 216 on the conduit wall.

More magnetic separator devices, such as but not limited to any of those disclosed in U.S. application Ser. No. 18/111,486, which is incorporated herein by reference, may also be employed to deposit magnetically labeled biological objects on the conduit wall during the magnetic sorting process.

After the magnetized magnetically labeled biological objects are deposited onto the conduit wall by the magnetic field emitted by the magnetic assembly as described above, the magnetic sorting process continues by removing the magnetic field from the conduit to demagnetize the magnetically labeled biological objects. This may be accomplished by separating the holder with the conduit attached thereto away from the magnetic assembly. As discussed above, simply removing the magnetic field may not cause the accumulation or buildup of magnetically labeled biological objects on the conduit wall to dislodge from the conduit wall and/or dissociate into individual biological objects for recovery, because the magnetic beads on a biological object may still experience magneto-static field from neighboring magnetic beads and/or magnetic beads of neighboring biological objects.

According to an embodiment of the present invention, the conduit is mechanically agitated or deformed by a mechanical means to cause the accumulated magnetically labeled biological objects to dislodge from the conduit wall and/or dissociate into individual biological objects for recovery.

Figure 13A:
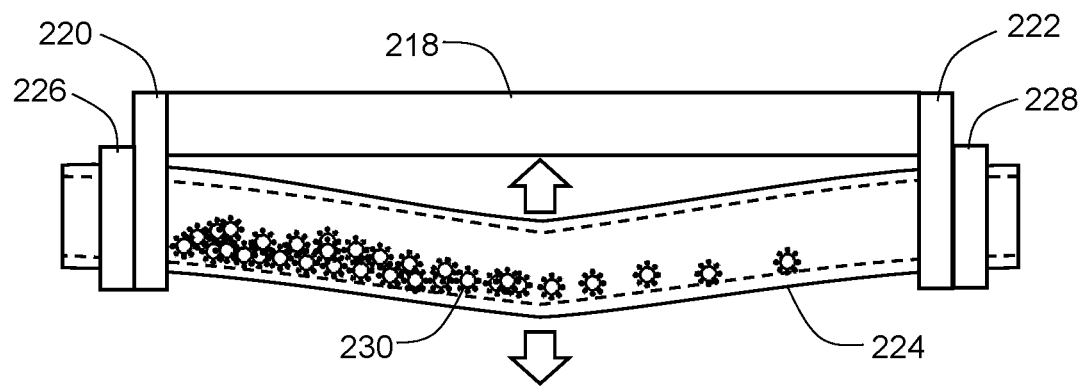
FIG. 13A is a side view showing application of transverse vibration to the conduit while being suspended on the holder to loosen magnetically labeled biological objects accumulated on the conduit wall.

FIG. 13A is a side view of a holder 218 that may be used in any of the magnetic separation devices disclosed. The holder 218 includes two supports or brackets 220 and 222 at two ends thereof. A conduit 224, which may include two collars 226 and 228 attached thereto, may be reversibly fastened to the holder 218 by snapping the collars 226 and 228 onto the brackets 220 and 222 of the holder 218. The conduit 224 may be stretched and straightened in between the collars 226 and 228 while being suspended on the holder 218, thereby ensuring that the flexible conduit 224 remains straight and aligns to the tip ends of a magnetic assembly when exposing the conduit 224 to the magnetic field during the magnetic sorting process.

With continued reference to FIG. 13A, one or more portions of the flexible conduit 224 between the two collars 226 and 228 may be repeatedly displaced in a transverse direction that is substantially perpendicular to the conduit 224 as a way to mechanically agitate or deform the conduit 224. The resultant transverse vibration of the conduit 224 may loosen or facilitate the loosening of the magnetically labeled biological objects 230 accumulated on the conduit wall.

Figure 13B:
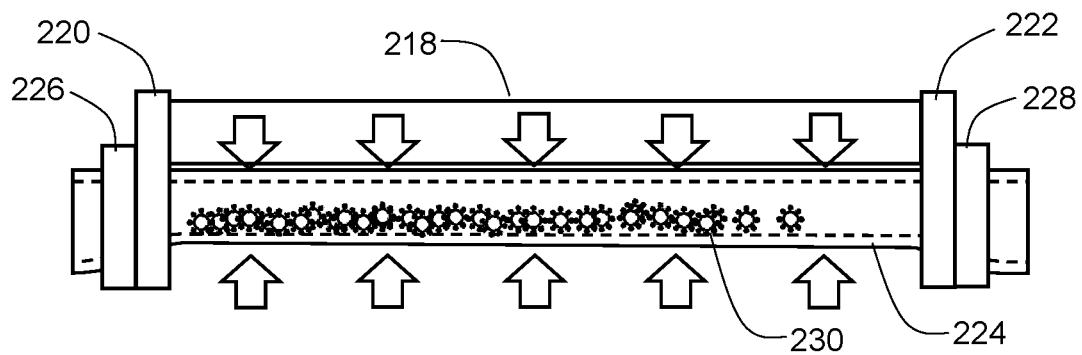
FIG. 13B is a side view showing the conduit being repeatedly compressed or pinched to loosen magnetically labeled biological objects accumulated on the conduit wall.
Figure 13C:
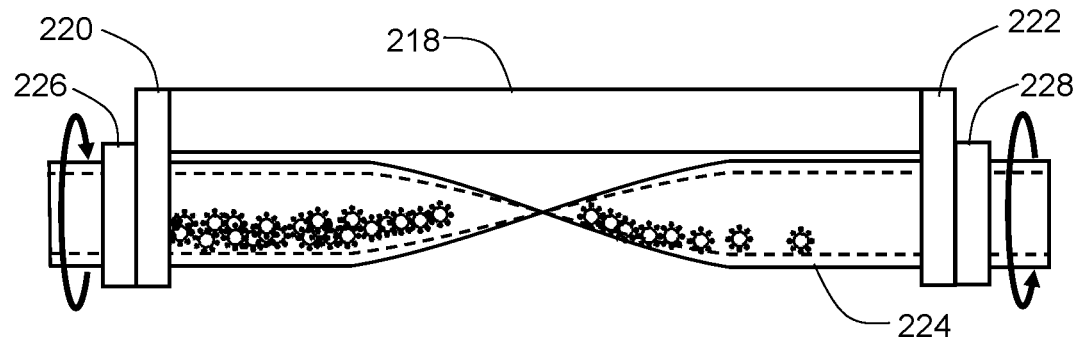
FIG. 13C is a side view showing the conduit being repeatedly twisted to loosen magnetically labeled biological objects accumulated on the conduit wall.

Other means of mechanical agitation or deformation may also be applied to the conduit 224 to loosen the magnetically labeled biological objects 230 accumulated on the conduit wall. FIG. 13B shows that the conduit 224 may be repeatedly compressed or pinched to dislodge or loosen the magnetically labeled biological objects 230 accumulated on the conduit wall. FIG. 13C shows that the conduit 224 may also be repeatedly twisted back-and-forth by applying opposite torques at two suitable locations of the conduit 224, respectively. For example and without limitation, the opposite torques may be applied at or near the collars 226 and 228. The conduit 224 may also be repeatedly stretched and relaxed to dislodge or loosen the magnetically labeled biological objects 230 accumulated on the conduit wall.

The mechanical agitation process for dislodging the magnetically labeled biological objects 230 accumulated on the conduit wall may be carried out using any of the above-described processes or any combination thereof. For example and without limitation, the conduit 224 may be transversely vibrated while being twisted.

The mechanical agitation or deformation process may be carried out while the conduit 224 is filled with a fluid, such as but not limited to a sample fluid or a buffer fluid. In an embodiment, a buffer fluid is continuously flowed through the conduit 224 during the mechanical agitation or deformation process.

Figure 14A:
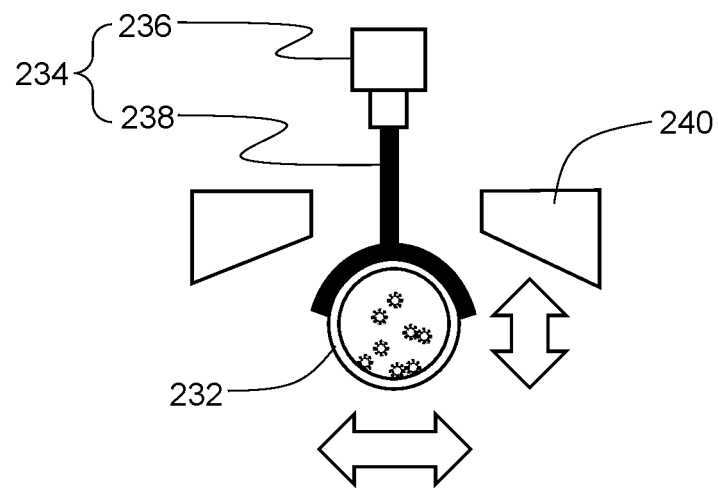
FIG. 14A is a cross-sectional view showing an apparatus for applying transverse vibration to the conduit.

FIG. 14A is a cross-sectional view showing an apparatus for applying transverse vibration to a conduit 232. The apparatus 234 includes an actuator 236 and an arm 238 with one end connected to the actuator 236 and the other end divided into a fork to clutch the conduit 232 and guide the motion thereof. The actuator 236 and the conduit 232 may be disposed on opposite sides of a holder 240, with the arm 238 reaching the conduit 232 through an opening or hole in the holder 240. Alternatively, the actuator 236 and the conduit 232 may be disposed on the same side of the holder 240. The conduit 232 may be suspended on the holder 240 at the collars thereof (not shown) while engaging the apparatus 234. The apparatus 234 may exert transverse vibration on the conduit 232 in a direction that is parallel to the arm 238, orthogonal to the arm 238, or any combination thereof. The transverse vibration may be applied to the conduit 232 using the apparatus 234 at one or more locations of the conduit 232. While the holder 240 in FIG. 14A is shown to have a concave profile, the apparatus 234 may work with any holder described above, regardless of the shape of the profile.

Figure 14B:
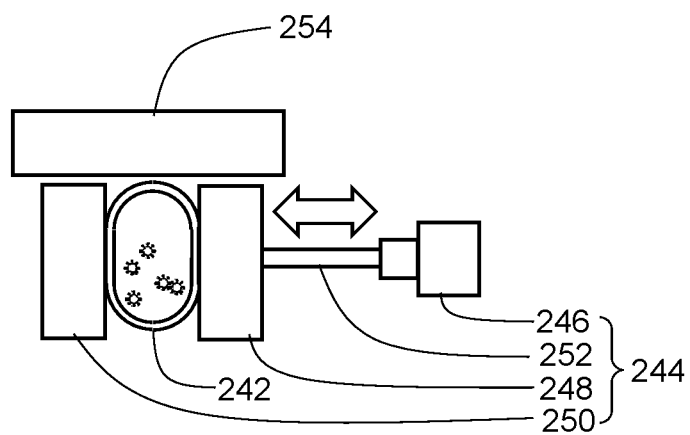
FIG. 14B is a cross-sectional view showing an apparatus for compressing or pinching the conduit.

FIG. 14B is a cross-sectional view showing an apparatus for compressing or pinching a conduit 242. The apparatus 244 includes an actuator 246, an actuated block 248 and a counter block 250 for squeezing the conduit 242 therebetween, an arm 252 connecting and transmitting force between the actuator 246 and the actuated block 248. The actuated block 248 and the counter block 250 may extend a portion or the entire length of the conduit 242 between the collars attached thereto or the brackets at two ends of the holder 254 (not shown). The apparatus 244 may repeatedly compress and decompress the conduit 242 to loosen the magnetically labeled biological objects accumulated on the conduit wall. While the holder 254 in FIG. 14B is shown to have a flat profile, the apparatus 244 may work with any holder described above, regardless of the shape of the profile.

Alternatively, the conduit 242 may be repeatedly squeezed between the actuated block 248 and the holder 254, which may serve as the counter block 250, by rearranging the positions of the actuator 246, the arm 252, and the actuated block 248. The conduit 242 may also be squeezed between the holder 254 and a roller (not shown) moving back and forth along the conduit 242.

Figure 15:
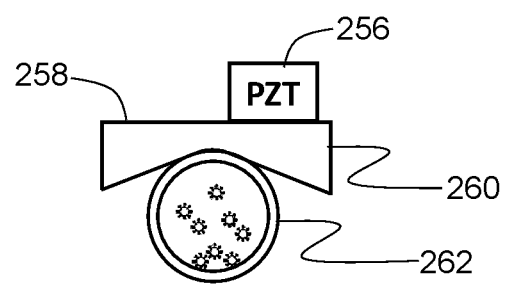
FIG. 15 is a cross-sectional view showing a conduit bonded onto a holder being vibrated by a piezoelectric transducer attached to the holder.

In some embodiments where the conduit is reversibly or irreversibly bonded onto the holder instead of using the collar/bracket locking mechanism, other mechanical agitation means may also be applied. For example and without limitation, FIG. 15 is a cross-sectional view showing a piezoelectric transducer 256 attached to the second surface 258 of a holder 260. The piezoelectric transducer 256 vibrates the holder 260 and the conduit 262 attached thereto, thereby facilitating the loosening of the magnetically labeled biological objects accumulated on the conduit wall.

In addition to mechanical agitation, a magnetic means may also be used to loosen or facilitate the loosening of the magnetically labeled biological objects accumulated on the conduit wall by applying a magnetic field to attract the magnetically labeled biological objects away from the conduit wall.

Figure 16A:
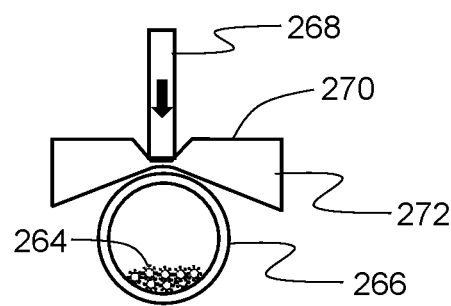
FIG. 16A is a cross-sectional view showing a magnetic source being used to attract magnetically labeled biological objects away from the bottom of the conduit.
Figure 16B:
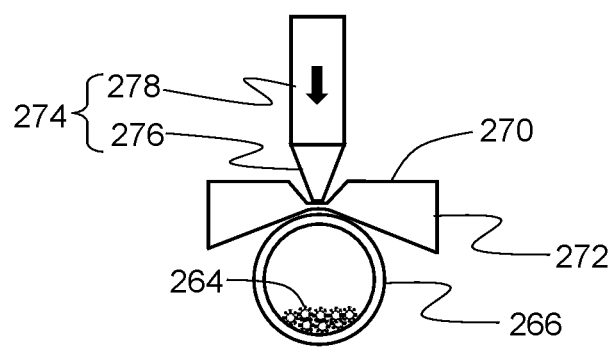
FIG. 16B is a cross-sectional view showing another magnetic source being used to attract magnetically labeled biological objects away from the bottom of the conduit.

FIG. 16A is a cross-sectional view showing magnetically labeled biological objects 264 collected on the bottom of a conduit 266 after exposing to a magnetic field generated by a magnetic assembly, such as but not limited to any of the magnetic assembly shown and described above. A magnetic source 268, which may comprise a permanent magnet or electromagnet, with one of its poles (e.g., North or South pole) contacting or disposed in close proximity to the conduit 266 at a location not covered with the magnetically labeled biological objects 264, thereby attracting the biological objects 264 away from the bottom of the conduit 266. In an embodiment, the magnetic source 268 is disposed adjacent to a notch on the second surface 270 of a holder 272. The notch allows the magnetic source 268 to be positioned closer to the conduit 266, thereby increasing the magnetic field strength and gradient. Such notch feature may be practiced with all holders disclosed herein. The magnetic field strength and gradient applied to the conduit 266 may be further increased by using a magnetic source 274 comprising a soft ferromagnetic guide 276 magnetically coupled to a permanent or electric magnet 278 to conduct and concentrate the flux from the magnet 278, as shown in FIG. 16B. Any of the magnetic means may be combined with any of the mechanical agitation means to loosen or facilitate the loosening of the magnetically labeled biological objects accumulated on the conduit wall.

The conduits 156, 192, 224, 232, 242, 262, 266 may be made of any suitable flexible or pliable material that may be deformed, such as but not limited to rubber, plastics, or any suitable polymeric material. The holders 126, 158, 194, 218, 240, 254, 260, 272 may be made of any suitable nonmagnetic material, such as but not limited to aluminum, glass, a nonferrous metal or alloy, plastics, or any suitable polymeric material. In some embodiments, a portion 214 of the holder 194 that comes into contact with the conduit 192 may be made of a magnetic material as shown in FIG. 12. The magnetic flux guides and shield 130, 132, 162-168, 196-200 each may be made of a soft magnetic material or a material with relatively high magnetic permeability that comprises any one of iron (Fe), cobalt (Co), nickel (Ni), or any combination thereof. For example and without limitation, any of the magnetic flux guides may be made of a permalloy comprising nickel and iron.

Figure 17:
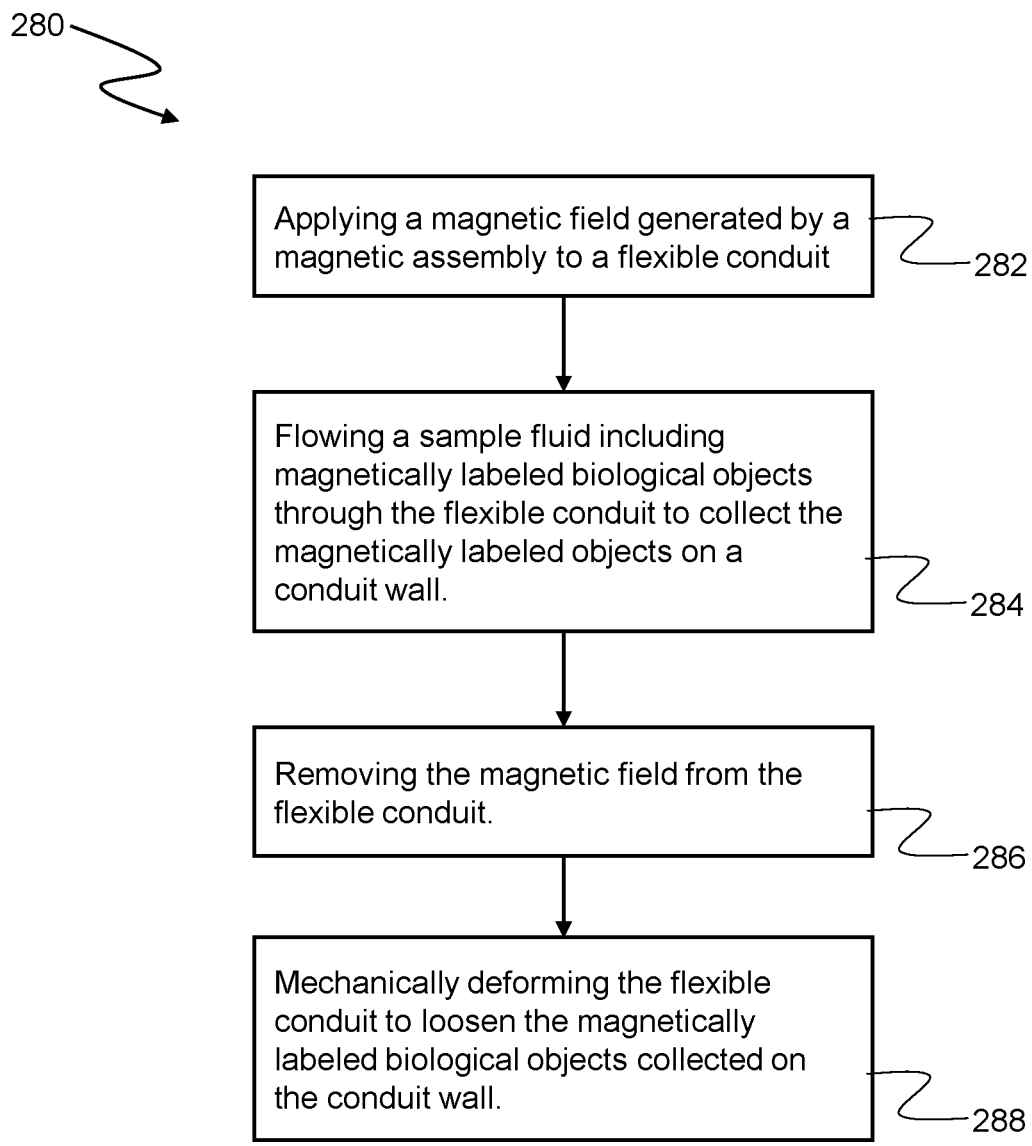
FIG. 17 illustrates a flow chart of selected steps for magnetically sorting biological objects in a sample fluid in accordance with an embodiment of the present invention.

FIG. 17 illustrates a flow chart of selected steps 280 for separating magnetically labeled biological objects from non-magnetic biological objects in a sample fluid in accordance with a method embodiment of the present invention. The operating steps 280 begin by applying a magnetic field generated by a magnetic assembly to a flexible conduit at step 282. For example and without limitation, this step may be carried out by moving the flexible conduit to a sorting position that places the flexible conduit in close proximity to or in contact with the magnetic assembly that generates the magnetic field in the flexible conduit as shown in FIGS. 8B, 10, and 12. The flexible conduit may be supported by a holder and may be reversibly attached to or suspended on a holder using a collar/bracket mechanism as described above. The holder may have any suitable shape, such as but not limited to those described above. The magnetic assembly may include at least a permanent or electrical magnet and optionally one or more magnetic flux guides to shape the magnetic field. For example and without limitation, any of the magnetic assemblies 122, 154, and 190 disclosed herein or any of the magnetic assemblies disclosed in U.S. application Ser. Nos. 16/729,398, 18/072,362, and 18/111,486 may be used in the current process.

After the flexible conduit is in the sorting position, a sample fluid containing magnetically labeled biological objects is flowed through the flexible conduit to collect the magnetically labeled biological objects on the conduit wall at step 284 owing to the magnetic attraction force resulted from the magnetic field generated by the magnetic assembly. At step 284, the flexible conduit may be squeezed between the holder and the magnetic assembly, and the cross section of the flexible conduit may become distorted from its original undeformed shape as shown in FIGS. 8B, 10, and 12.

After the magnetically labeled biological objects are collected on the conduit wall at step 284, the magnetic field is removed from the flexible conduit at step 286, which may be accomplished by moving the flexible conduit and the holder to a recovery position away from the magnetic field.

After the magnetic field is removed from the flexible conduit, the flexible conduit is mechanically deformed or agitated to loosen the magnetically labeled biological objects collected on the conduit wall at step 288. This step may be carried out while the flexible conduit is filled with a fluid or while a buffer fluid is continuously flowed through the flexible conduit. The step of mechanically deforming the flexible conduit may be carried out by applying transverse vibration to the flexible conduit, repeatedly pinching the flexible conduit, repeatedly twisting the flexible conduit, repeatedly stretching and relaxing the flexible conduit, or any combination thereof, as shown in FIGS. 13 and 14 and described above. For example and without limitation, the transverse vibration may be applied using an apparatus that includes an arm with a fork end clutching the flexible conduit while the flexible conduit is attached to or suspended on a holder as shown in FIG. 14A and described above. The step of mechanically deforming the flexible conduit may be carried out in combination with another magnetic field that attracts the magnetically labeled biological objects away from the conduit wall, as shown in FIGS. 16A and 16B and described above.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶ 6. In particular, the use of "step of" in the claims herein is not intended to invoke the provisions of 35 U.S.C. § 112, ¶ 6.

What is claimed is:

1. A process for magnetically sorting biological objects including the steps of:
    applying a magnetic field generated by a magnetic assembly to a flexible conduit;
    flowing a sample fluid including magnetically labeled biological objects through the flexible conduit to collect the magnetically labeled biological objects on a conduit wall;
    removing the magnetic field from the flexible conduit; and
    repeatedly stretching the flexible conduit by displacing one or more portions of the flexible conduit in a transverse direction perpendicular to the flexible conduit to loosen the magnetically labeled biological objects collected on the conduit wall after removing the magnetic field from the flexible conduit.

2. The process of claim 1, wherein the flexible conduit is supported by a holder.

3. The process of claim 2, wherein the flexible conduit is suspended on the holder by two collars fastened to two brackets on the holder.

4. The process of claim 2, wherein the flexible conduit is squeezed between the holder and the magnetic assembly in the step of flowing the sample fluid.

5. The process of claim 4, wherein a cross section of the flexible conduit is distorted from an undeformed shape.

6. The process of claim 1, wherein the step of applying the magnetic field is carried out by moving the flexible conduit to a sorting position that places the flexible conduit in contact with the magnetic assembly.

7. The process of claim 1, wherein the step of removing the magnetic field is carried out by moving the flexible conduit away from the magnetic assembly.

8. The process of claim 1, wherein the step of repeatedly stretching the flexible conduit is carried out while the flexible conduit is filled with a fluid.

9. The process of claim 1, wherein the step of repeatedly stretching the flexible conduit is carried out while a buffer fluid is continuously flowed through the flexible conduit.

10. The process of claim 1, wherein the step of repeatedly stretching the flexible conduit is carried out in combination with another magnetic field that attracts the magnetically labeled biological objects away from the conduit wall.

11. The process of claim 1, wherein the magnetic assembly includes:
    a permanent magnet having first and second poles;
    a first magnetic flux guide including a first tip having a tapering shape and a first base magnetically coupled to the first pole;
    a second magnetic flux guide including a second tip having a tapering shape and a second side base magnetically coupled to the second pole,
    wherein the first and second magnetic flux guides are parallel at the first and second bases and bent with the first and second tips arched over the permanent magnet disposed between the first and second bases.

12. The process of claim 1, wherein the magnetic assembly includes:
    a permanent magnet having first and second poles;
    a center magnetic flux guide including a center tip having a tapering shape and a center base magnetically coupled to the first pole;
    a bottom magnetic flux guide magnetically coupled to the second pole;
    a first side magnetic flux guide including a first side tip and a first side base magnetically coupled to the second pole through the bottom magnetic flux guide;
    a second side magnetic flux guide including a second side tip and a second side base magnetically coupled to the second pole through the bottom magnetic flux guide,
    wherein the first and second side magnetic flux guides are disposed on opposite sides of the center magnetic flux guide with the first and second side tips bending toward the center tip.

13. The process of claim 1, wherein the magnetic assembly includes:
    first and second permanent magnets each having first and second poles;
    a center magnetic flux guide including a center tip having a tapering shape a center base magnetically coupled to the first poles of the first and second permanent magnets, respectively;
    a first side magnetic flux guide including a first side tip and a first side base magnetically coupled to the second pole of the first permanent magnet;
    a second side magnetic flux guide including a second side tip and a second side base magnetically coupled to the second pole of the second permanent magnet,
    wherein the first and second side magnetic flux guides are disposed on opposite sides of the center magnetic flux guide with the first and second side tips positioned above the center tip and pointed at each other.

14. The process of claim 13, wherein ends of the first and second side tips each have a chisel edge profile with a bevel side facing away from the center magnetic flux guide.

15. A process for magnetically sorting biological objects including the steps of:
    applying a magnetic field generated by a magnetic assembly to a flexible conduit;
    flowing a sample fluid including magnetically labeled biological objects through the flexible conduit to collect the magnetically labeled biological objects on a conduit wall;
    removing the magnetic field from the flexible conduit; and
    applying transverse vibration to the flexible conduit to loosen the magnetically labeled biological objects collected on the conduit wall,
    wherein the transverse vibration is applied using an apparatus that includes an arm with a fork end clutching the flexible conduit while the flexible conduit is suspended on a holder.

16. A process for magnetically sorting biological objects including the steps of:
    applying a magnetic field generated by a magnetic assembly to a flexible conduit;
    flowing a sample fluid including magnetically labeled biological objects through the flexible conduit to collect the magnetically labeled biological objects on a conduit wall;
    removing the magnetic field from the flexible conduit; and mechanically deforming the flexible conduit to loosen the magnetically labeled biological objects collected on the conduit wall after removing the magnetic field from the flexible conduit, wherein the step of mechanically deforming the flexible conduit is carried out by repeatedly pinching the flexible conduit, or repeatedly twisting the flexible conduit, or repeatedly stretching and relaxing the flexible conduit.

* * * * *